United States Patent [19]

Horowitz et al.

[11] Patent Number: 5,712,537
[45] Date of Patent: Jan. 27, 1998

[54] HIGH FREQUENCY SCAN CONVERTER

[75] Inventors: Harvey J. Horowitz; Bernard Horowitz, both of Monroe, N.Y.

[73] Assignee: Real Time Electronics, Corporation, Monroe, N.Y.

[21] Appl. No.: 180,128

[22] Filed: Jan. 11, 1994

Related U.S. Application Data

[63] Continuation-in-part of Ser. No. 3,110, Jan. 11, 1993, abandoned.

[51] Int. Cl.⁶ .................................................. H03K 17/88
[52] U.S. Cl. ................................... 315/374; 315/5.38
[58] Field of Search ............................. 315/369, 366, 315/372, 374, 3.5, 5.29, 5.38; 348/811, 812

[56] References Cited

U.S. PATENT DOCUMENTS

| | | |
|---|---|---|
| 2,189,588 | 1/1940 | Hollmann . |
| 3,787,747 | 1/1974 | Scott . |
| 3,878,532 | 4/1975 | Buck . |
| 4,005,408 | 1/1977 | Taylor et al. . |
| 4,328,466 | 5/1982 | Norris, Jr. et al. . |
| 4,647,909 | 3/1987 | Spalding . |
| 5,202,692 | 4/1993 | Huguenin et al. . |
| 5,239,598 | 8/1993 | Wight et al. . |

FOREIGN PATENT DOCUMENTS

A 749447 of 1956 United Kingdom .

*Primary Examiner*—Theodore M. Blum
*Attorney, Agent, or Firm*—Richard B. Klar, Esq.

[57] ABSTRACT

By using a sheet beam and a charge-storing target measuring the differential of the deposited charge, one can greatly improve the performance of a scan converter. A segmented target provides instantaneous analog output.

45 Claims, 18 Drawing Sheets

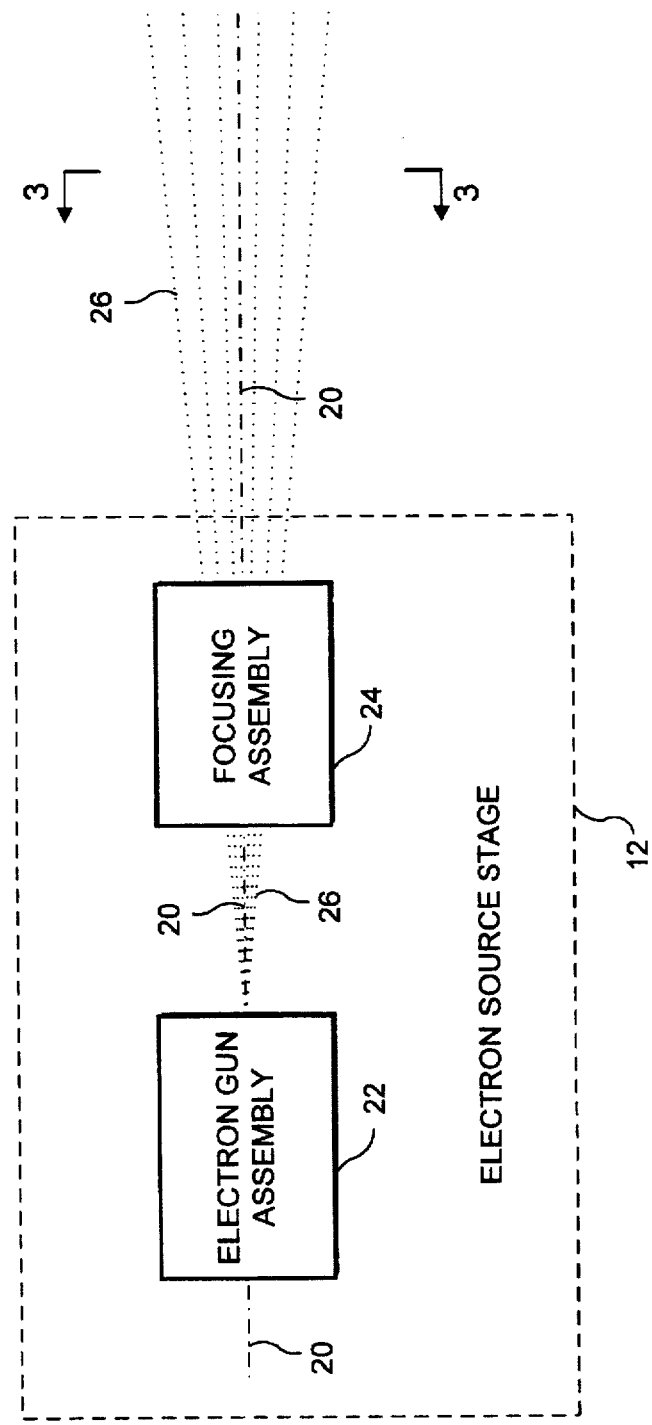

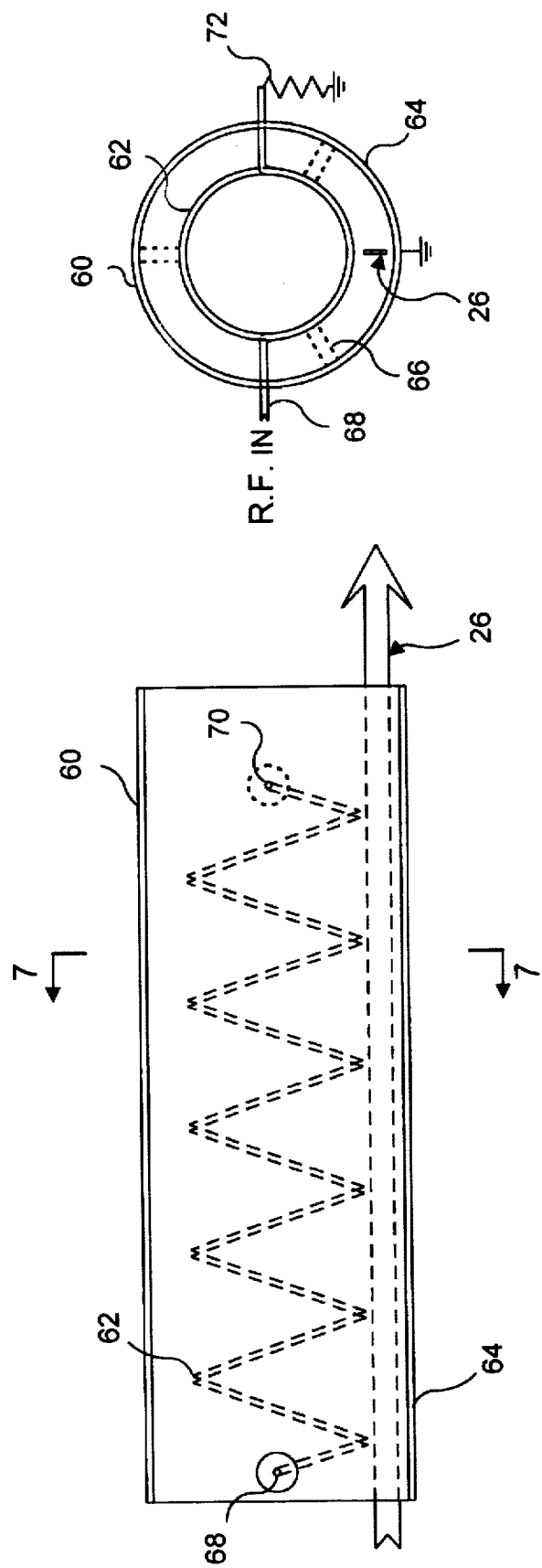

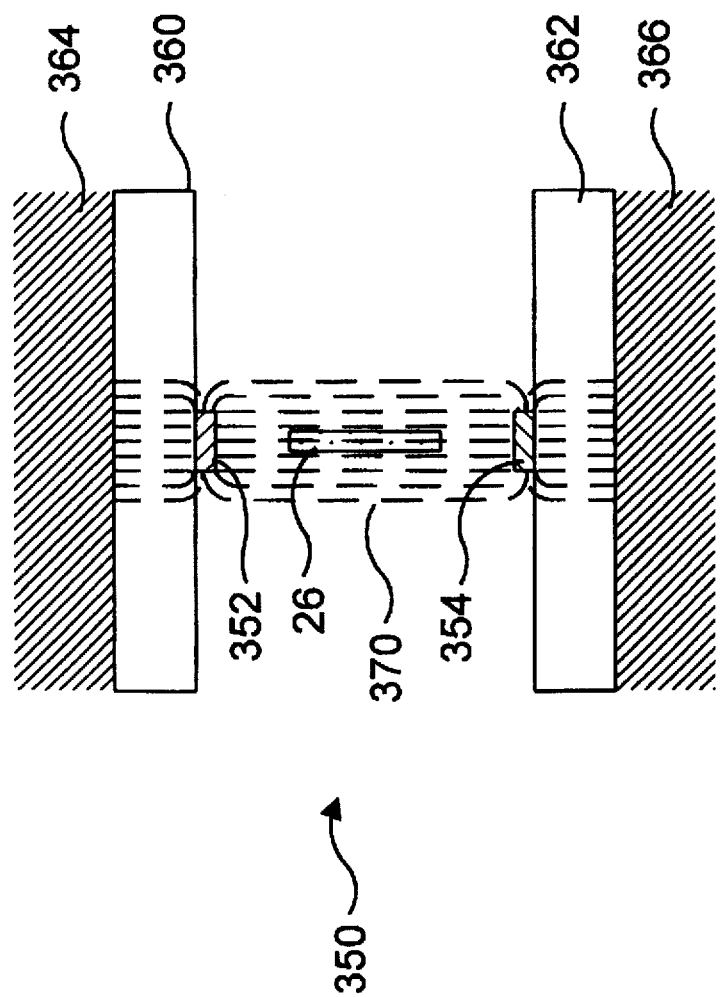

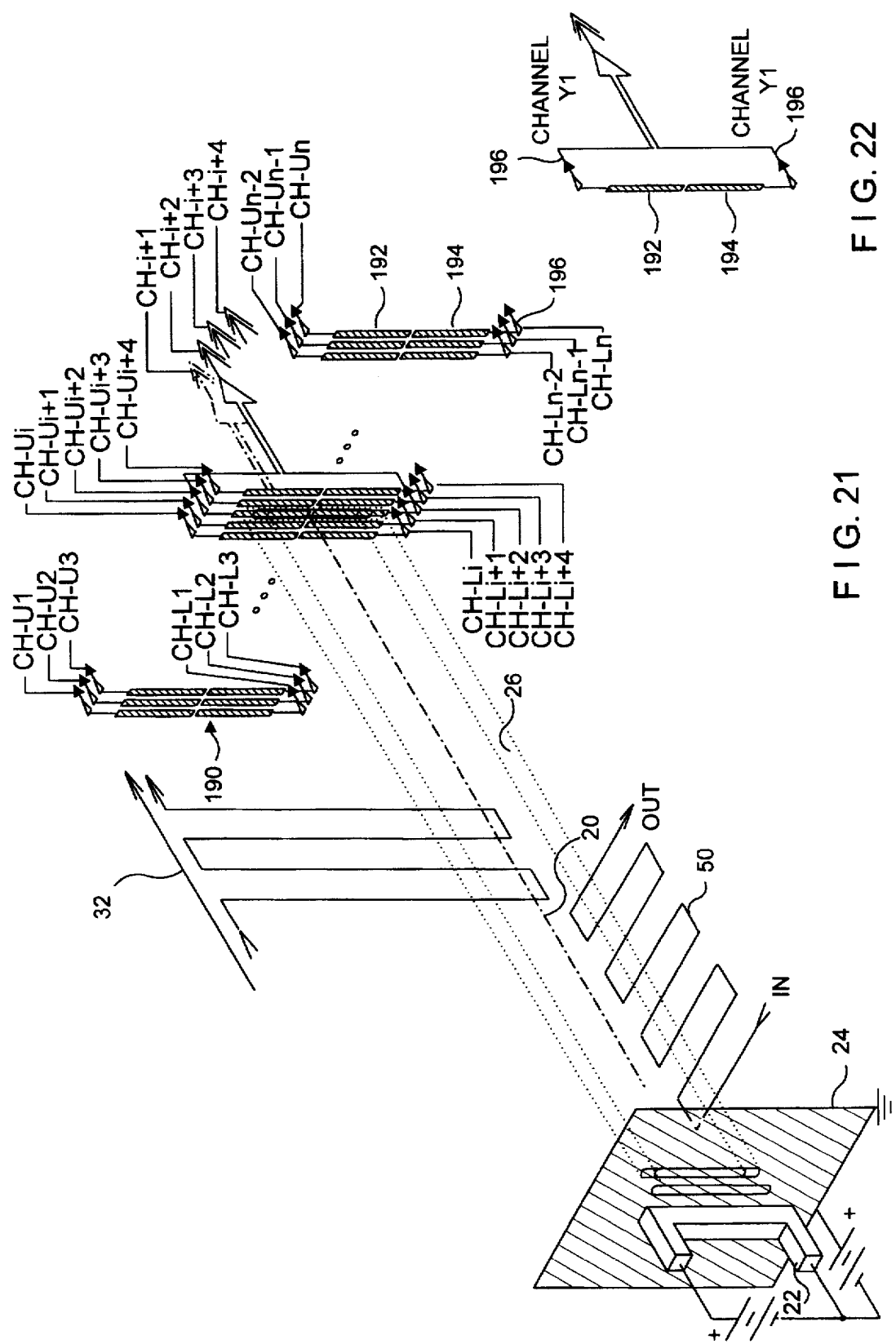

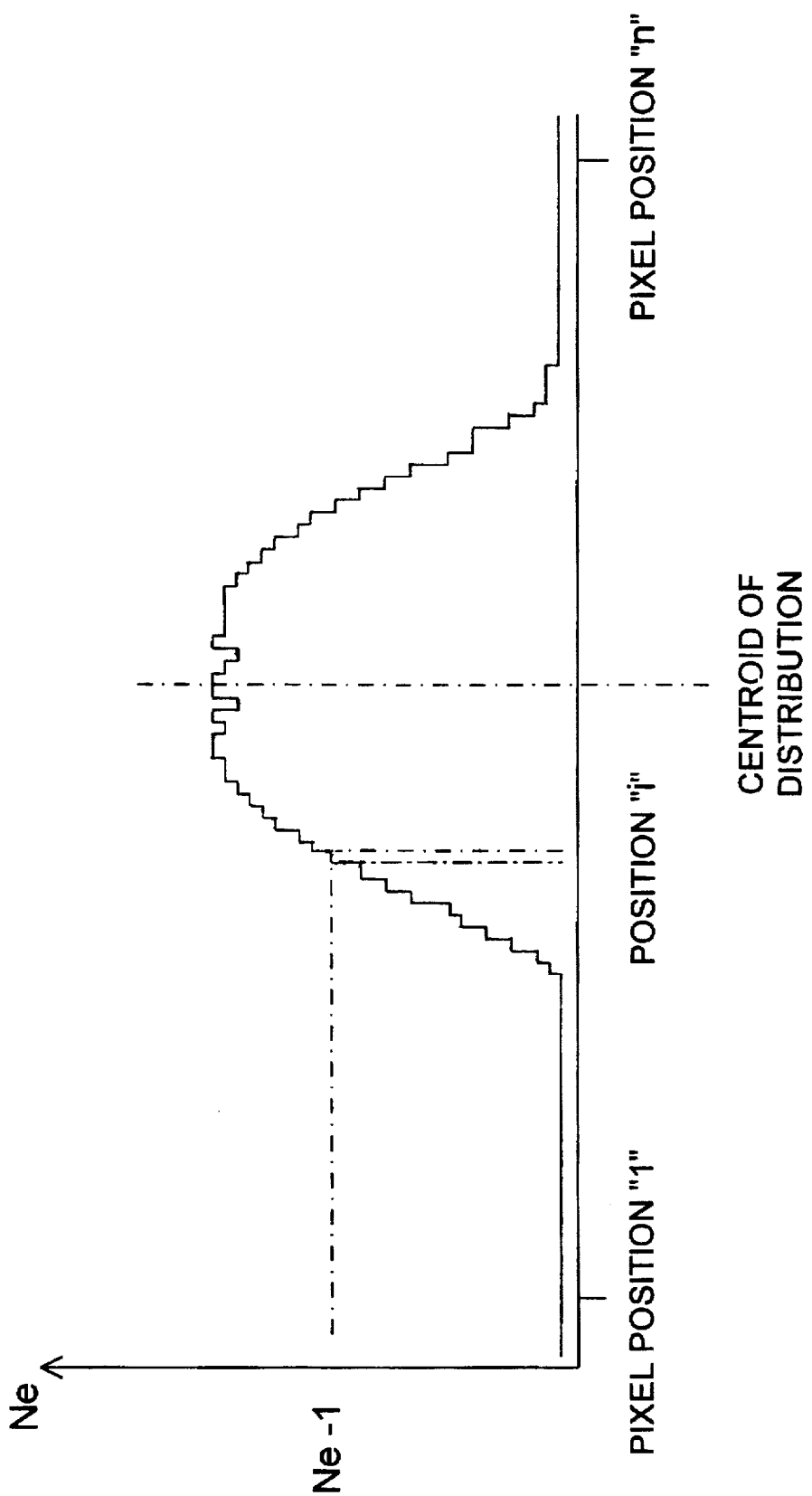
F I G. 25

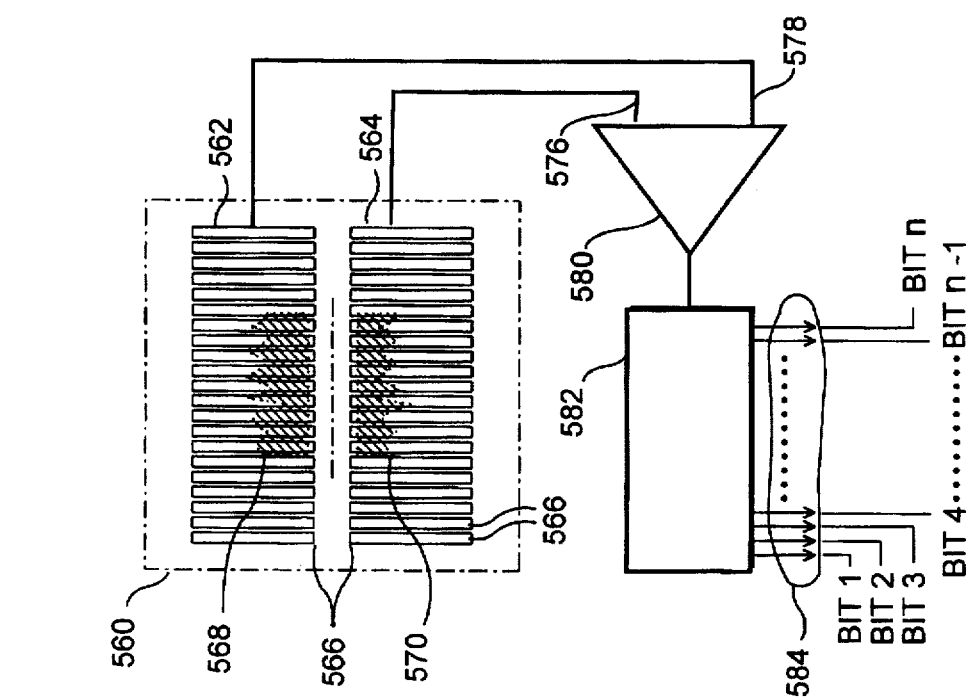
FIG. 29
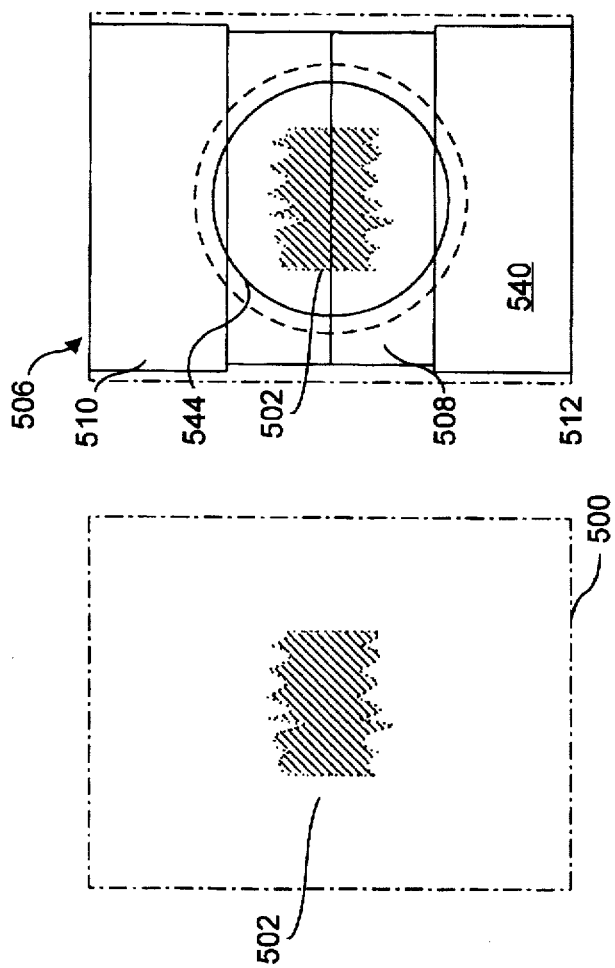
FIG. 28
FIG. 27

HIGH FREQUENCY SCAN CONVERTER

CROSS-REFERENCE TO RELATED APPLICATION

This is a continuation-in-part of application Ser. No. 08/003,110, filed Jan. 11, 1993, now abandoned.

TECHNICAL FIELD

This invention relates to scan converters. Specifically, the invention concerns a device capable of measuring signals from DC, to microwave, millimeter wave, and beyond.

BACKGROUND ART

To observe the waveform of a signal in real time, one typically uses an oscilloscope. At low frequencies, existing technology provides a serviceable result. However, when one attempts to measure signals in the microwave range as well as over extended frequency ranges, certain problems are encountered which limit the usable bandwidth of the instrument.

For example, as the frequency of the input signal rises, the phase distortion within the measuring equipment will increase. Similarly, there will be increased loss within the equipment. Additionally, as the sweep speed (i.e., writing speed in a conventional oscilloscope) increases, the amount of beam current required to maintain a usable image increases.

One could shorten the beam path to lessen the effects of phase distortion, high frequency loss, and defocusing, but this would cause a decrease in deflection sensitivity. Moreover, although conventional practice dictates that one would normally try to maintain a highly focused electron beam to insure a projection of high resolution, the deflecting signal acts to defocus the beam.

It is therefore desirable to provide an apparatus that provides a sensitive measurement of the input signal over an extremely wide frequency range without encountering the problems outlined above.

DISCLOSURE OF INVENTION

These and other objects are achieved by the scan converter described here. One embodiment of the scan converter has an electron gun that provides a stream of electrons shaped by a focusing assembly. The gun and focusing assembly work in concert to provide a sheet beam, having an approximately rectangular or elliptical cross-section. Minimal or no focusing is applied in the vertical direction. This yields a significant improvement in beam current. Since the beam need not be sharply focused, any defocusing that occurs over the path of the beam has no effect on the performance of the device.

The beam is directed along an electron boresight that passes through a vertical deflection assembly responsive to the input signal. The vertical deflection assembly can be a single unit or a combination of several sub-assemblies, each optimized for loss, phase response, and gain. The input signal that ultimately controls the deflection of the beam can be amplified using individual amplifiers optimized for each of the band segments in question. Since the signals are applied sequentially along the electron boresight, each amplifier after the first is followed by a delay module that delays its respective signal an appropriate amount such that the various deflection segments at any given point in time are applied to the same point on the electron beam. This arrangement will yield high deflection sensitivity over a large bandwidth. In essence, the device is an analog-to-digital converter of very large bandwidth.

Because amplifier gain is more difficult to achieve as the frequency increases, it is preferable to position vertical deflection sub-assemblies for the highest frequencies closest to the electron source. This has the effect of minimizing the gain requirements for the more critical high-frequency vertical deflection sub-assemblies and the losses incurred in the delay modules. Another arrangement uses a single covered microstrip to provide the necessary deflection over the operating frequency range.

Following vertical deflection, horizontal deflection can be applied to sweep the beam across a target. One method for providing horizontal deflection uses a pair of inductors surrounding the electron beam. Another method uses a second electron beam to charge a pair of plates through which the beam passes. In applications where a horizontal sweep is unnecessary, this stage can be omitted.

At the end of the electron boresight of the device, the beam impacts a target, which is used to determine the amount of deflection of the beam. One embodiment uses a series of upper and lower sensing plates forming a row of paired plates. The plates are connected to amplifiers and the outputs of the amplifiers for each respective pair are compared to provide a differential signal proportional to deflection. Because it is necessary to determine only the differential change in the received signal, a very small deflection of the beam will yield a large change at the output of the differential stage. Therefore, the converter has extremely high gain. Another scheme uses an array of charge-coupled devices (CCDs). Yet another method for determining the amount of deflection develops an optical image of the beam which is then split and projected onto adjacent, spaced-apart CCD arrays.

To protect the target, a beam parking device is provided to capture and recirculate the energy of the beam during periods when the beam is not otherwise deflected. A voltage lower than the high, target voltage is applied to the beam parking device to decelerate the beam and lessen the power required during such periods.

BRIEF DESCRIPTION OF DRAWINGS

A more complete understanding of the present invention, as well as other objects and advantages thereof not enumerated herein, will become apparent upon consideration of the following detailed description and the accompanying drawings, wherein:

FIG. 2 is a drawing of an electron source stage and a generated electron beam;

FIG. 3 is a drawing of the cross-section of the electron beam of FIG. 2;

FIGS. 6 and 7 are partial side and cross-sectional views, respectively, of a helical slow-wave module;

FIGS. 9, 10, and 11 are side, cross-sectional, and perspective views, respectively, of a waveguide-type slow-wave module;

FIG. 15 is a cross-sectional view of a full stripline vertical deflection module;

FIG. 21 is a perspective view of a scan converter having a charge storage array for a target assembly;

FIG. 22 is a perspective view of a single charge storage array pair and an associated differential amplifier;

FIG. 25 is a plot of electron distribution across a target assembly having an array of charge coupled devices;

FIG. 27 is a drawing of a phosphor screen with a superimposed screen image;

FIG. 28 is a drawing of a screen image at the focal plane of the beam-splitting assembly; and FIG. 29 is a drawing of a charge storage array and an associated signal processor for use with the target assembly of FIG. 26.

BEST MODE FOR CARRYING OUT THE INVENTION

Figure 1:
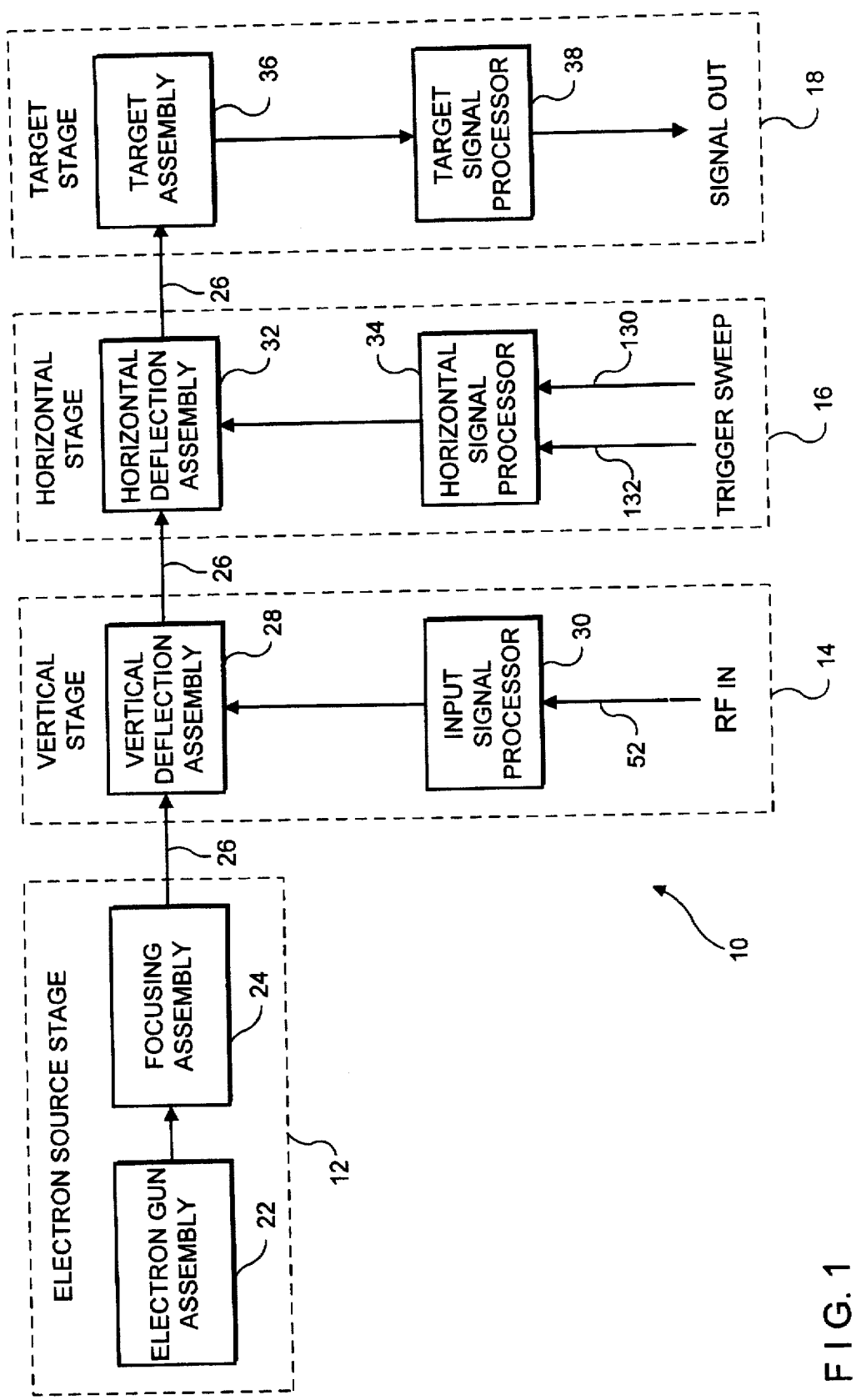
FIG. 1 is a block diagram of a scan converter.

The high frequency scan converter 10 is shown generally in FIG. 1. The figure shows four stages: an electron source stage 12, a vertical stage 14, a horizontal stage 16, and a target stage 18. The four stages are positioned in linear optical alignment along an electron boresight 20, which when appropriate is located in an evacuated enclosure. Note that one could place the horizontal stage 16 before the vertical stage 14 if desired. Also, the path need not be linear. By use of the appropriate magnetic field, the path between the various components could be folded or reoriented to make a more compact device.

The Electron Source Stage

The electron source stage 12 has two components: an electron gun assembly 22 and a focusing assembly 24. The electron gun assembly 22 generates a beam 26 that has an approximately rectangular or elliptical cross-section, essentially forming a "sheet" of electrons, and thus may be referred to as a sheet beam, as illustrated in FIGS. 2 and 3. The longer dimension of the cross-section of the beam is aligned with the vertical axis. It should be understood that the beam is vertically oriented because other portions of the device are similarly oriented; one could choose a different orientation. Also, while a beam having a generally rectangular or elliptical cross-section is preferable, the invention could be used with a beam having a round or another cross-section, or even an unfocused beam.

The electron gun assembly 22 may be a single vertical line hot filament. This configuration will provide the proper profile for a sheet beam. Preferably, the filament is provided with an oxide coating as it will exhibit better emission characteristics. Alternatively, one could use a cold boron-doped diamond (solid state) field emitter as a source of electrons. It should be understood that the invention is not limited to electron beams. One could use other types of energy such as charged hydrogen atoms.

The focusing assembly 24 operates largely in one dimension to further shape the beam 26 into a sheet. The focusing assembly 24 may be electrostatic, magnetic, or electromagnetic. One could use two capacitive plates vertically aligned with respect to the path of the beam. Alternatively, one could employ a quadrapole that is electrostatic, magnetic, or electromagnetic, although an electrostatic configuration is preferable. Discussions of suitable focusing devices can be found in A. B. El-Kareh and J. C. J. El-Karch, *Electron Beams, Lenses, and Optics*, Volume 1, Academic Press (New York: 1970), Section 4.10—The Types of Electrostatic Lenses, pp. 62–65, and P. W. Hawkes, *Quadrapoles in Electronic Lens Systems*, Academic Press (New York: 1970).

The Vertical Stage

As shown in FIG. 1, the vertical stage 14 has a vertical deflection assembly 28 and an input signal processor 30. The vertical deflection assembly 28 modulates the position of the beam 26 according to the input it receives from the input signal processor 30. The vertical deflection assembly 28 and the input signal processor 30 are shown in greater detail in FIG. 4.

Figure 4:
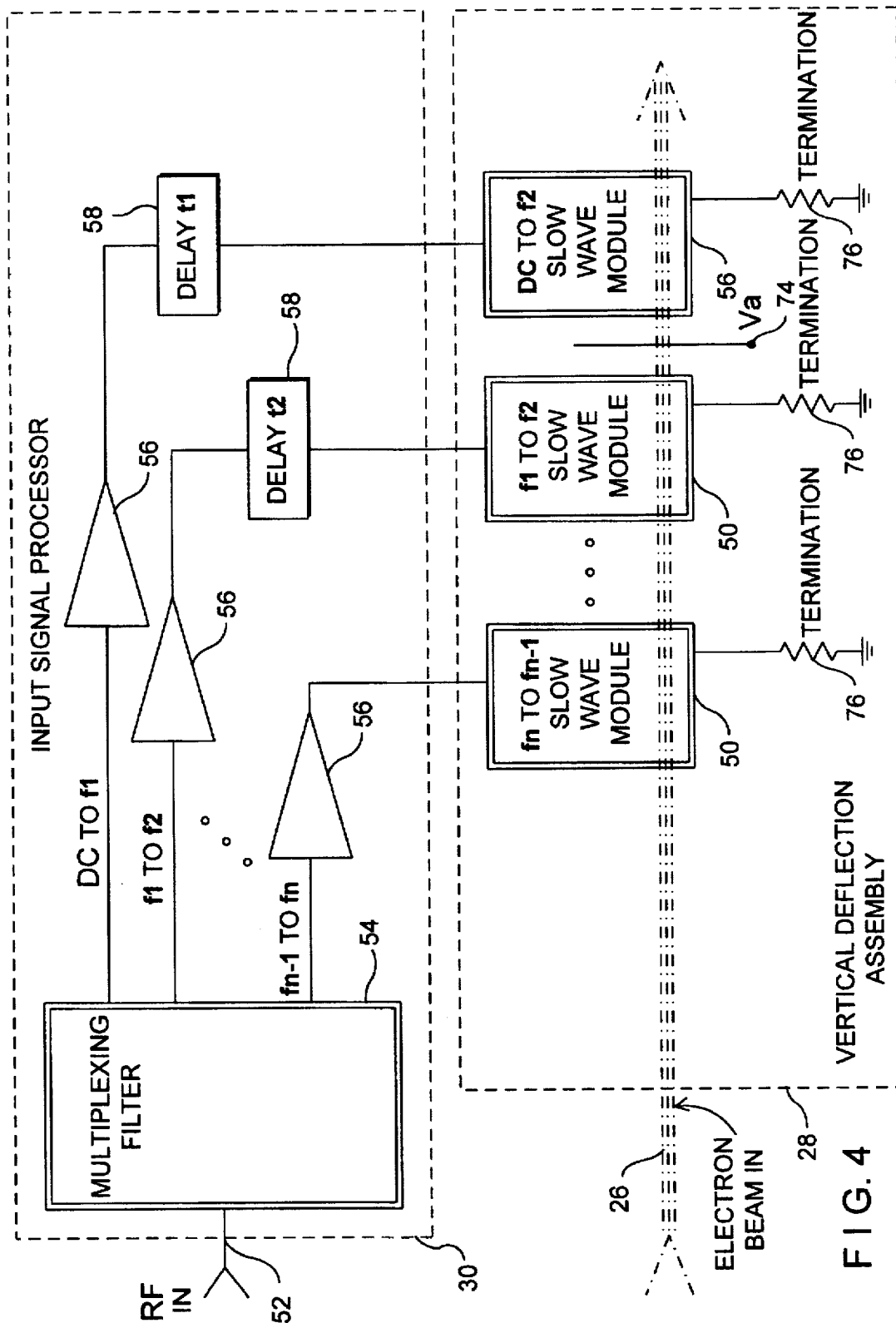
FIG. 4 is a block schematic diagram of a vertical deflection assembly and an input signal processor.
Figure 5:
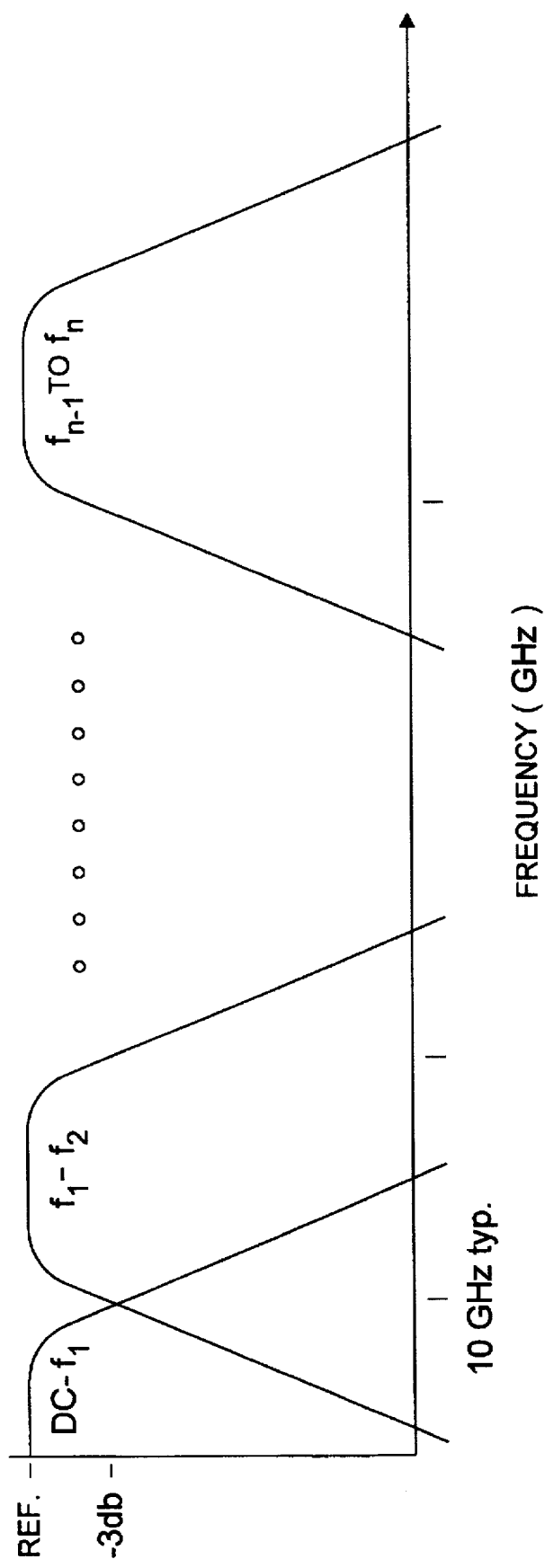
FIG. 5 is a frequency plot showing the distribution and coverage of the subassemblies of the vertical deflection assembly of FIG. 4.

The vertical deflection assembly 28 is designed to work over the entire frequency range of the scan converter 10. The assembly 10 generates a wave having an effective velocity in synchronism with the beam velocity, enabling the wave to act upon the beam 26, thereby producing a net deflection of the beam 26. As shown in FIG. 4, it contains one or more slow-wave modules 50, each covering a different band segment. The slow-wave modules 50 synchronize the input signal with the transit velocity of the beam 26. Each module 50 covers a different band segment, as illustrated by the frequency plot in FIG. 5:

Band 1: DC-$f_1$

Band 2: $f_1$-$f_2$

●

●

●

Band n: $f_{n-1}$-$f_n$

For the first band segment, covering the lowest frequencies (DC to, e.g., 5–10 GHz), one may employ a helix or some other suitable arrangement. For the remaining segments (bands 2-n), one may use waveguide sections covering, e.g., 10–20 GHz, 20–30 GHz, and 30–40 GHz. As noted earlier, the modules 50 covering the higher frequencies are preferably located closer to the electron source stage 12. However, they can be arranged differently if so desired.

Each module 50 also has a termination resistor 76. Regardless of which structure or structures are used for the slow-wave modules 50, the velocity of the beam 26 is chosen to match the linear velocity of the input signal as it passes through the module 50.

The input signal processor 30 provides the drive for the vertical deflection assembly 28. As illustrated in FIG. 4, the processor 30 has an input 52, a multiplexing filter 54, bandwidth-optimized amplifiers 56, and delay modules 58. The multiplexing filter 54 divides the input signal of the input signal processor 30 into n band segments. These signals are amplified by the low-noise amplifiers 56 and routed to the respective slow-wave modules 50. The delay modules 58 are inserted after the amplifiers 56 for every band segment but the first, as the respective signals must be delayed so that they arrive at their respective slow-wave modules 50 synchronously with the relevant portion of the beam 26. If desired, the delay modules 58 could be inserted before the amplifiers 56 or at some other point where a delay can be introduced.

If the linear velocity of the input signal varies from one module 50 to another, acceleration and/or deceleration grids 74 can be inserted as necessary between the modules 50 to compensate for such velocity differences. A grid 74 to which a voltage $V_a$ is applied is shown in between the respective modules 50 for the $f_1$–$f_2$ and DC–$f_1$ bands. The grid 74 can be a simple plate with a round aperture.

The embodiment discussed here shows an RF signal input to the input signal processor 30. Alternatively, one could use an optical input to a photodiode, taking the output of the photodiode and running that into the multiplexing filter 54.

Slow-Wave Structures

A slow-wave module 60 using a helical structure is illustrated in FIGS. 6 and 7. The module 60 has a conducting helix 62 supported within an outer shield 64 by a dielectric spacer 66. The helix 62 has an electrical input 68 and an electrical output 70 connected to ground through a termination resistor 72. The electron beam 26 passes between the helix 62 and the outer shield 64, with the energy passing through the adjacent portion of the helix 62 imparting a deflection to the beam 26. If desired, one could provide a gradual widening along the length of the outer shield 64 to provide clearance for the deflected beam 26.

Figure 8:
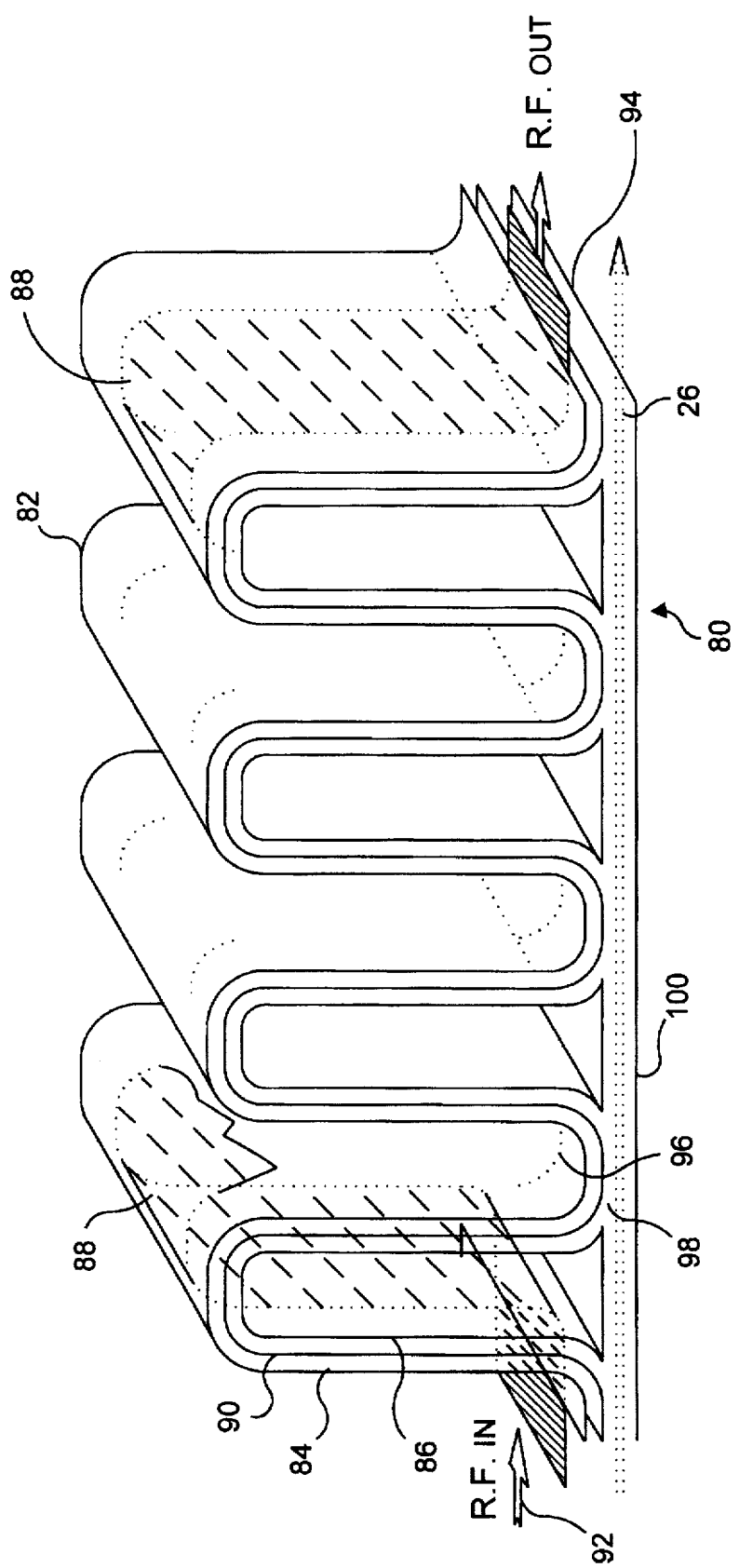
FIG. 8 is a drawing of a serpentine slow-wave module.

A slow-wave module 80 using a serpentine slow-wave structure is illustrated in FIG. 8. Using full stripline architecture, the module 80 has a stripline 82 folded into an accordion-like arrangement. The stripline 82 has two groundplanes 84 and 86 and a center conductor strip 88 carried on a dielectric 90. The stripline 82 has an electrical input 92 and an electrical output 94 connected to a termination which can have an impedance of 50 ohms or another suitable value.

At the bottom of each fold 96, the outer groundplane 86 is cut away to provide a slit aperture 98 exposing the center conductor strip 88. To provide electrical continuity (and the least amount of discontinuity) for the stripline, a groundplane sheet 100 is positioned beneath the stripline 82 effectively covering the apertures 98. The beam 26 passes between the stripline 82 and the groundplane sheet 100 and is deflected by energy in the center conductor strip 88.

It should be recognized that one may also use either the helical slow-wave module 60 or the stripline slow-wave module 80 in a balanced or differential mode. In either case, two such slow-wave modules 60 or 80 are placed one on top of the other, and the beam 26 is directed between them.

A slow-wave module 110 utilizing a waveguide structure is illustrated in FIGS. 9, 10, and 11. The module 110 uses a waveguide 112 having a generally square cross-section. The waveguide 112 has ridge irises 114 protruding from the top and bottom walls 116 and 118 at periodic intervals along the length of the waveguide 112. The waveguide 112 is provided with an appropriate input 120 and output 122. The electron beam 26 passes through the waveguide 112, interacting with the RF energy introduced at the input 120. It should be understood that other types of waveguides, i.e., other than ridged-type waveguide and having other cross-sections, could be used for the waveguide structure 112.

Instead of using separate band-specific slow-wave modules 50, one could employ a single module 50 covering the entire operating range. Where only a single such module 50 is employed, the input signal processor 30 would not require the multiplexing filter 54 or the other components associated with multiple slow-wave structures. Moreover, one could restrict the frequency range of the entire assembly to a specific bandwidth, e.g., 50–100 GHz, thus creating a bandpass device. This would have the added benefit of simplifying the component design requirements since the high-to-low frequency ratio would be 2:1 instead of an infinite ratio in the case where one is going from DC to $f_{max}$. Finally, one could arrange several scan converters, each covering a separate band, combining the outputs (each of which are developed as explained below), to provide a converter that covers the aggregate of the individual bands.

Figure 13:
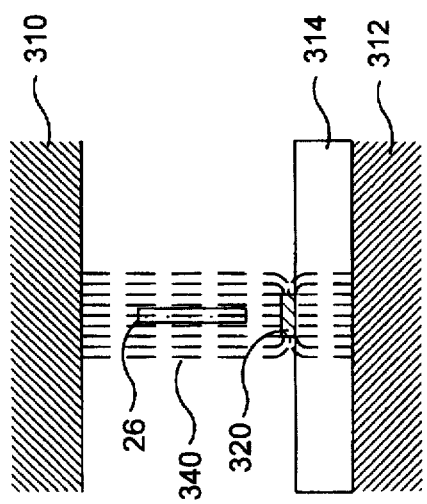
FIGS. 12, 13, and 14 are partial side, cross-sectional, and top views, respectively, of a covered microstrip vertical deflection module.
Figure 12:
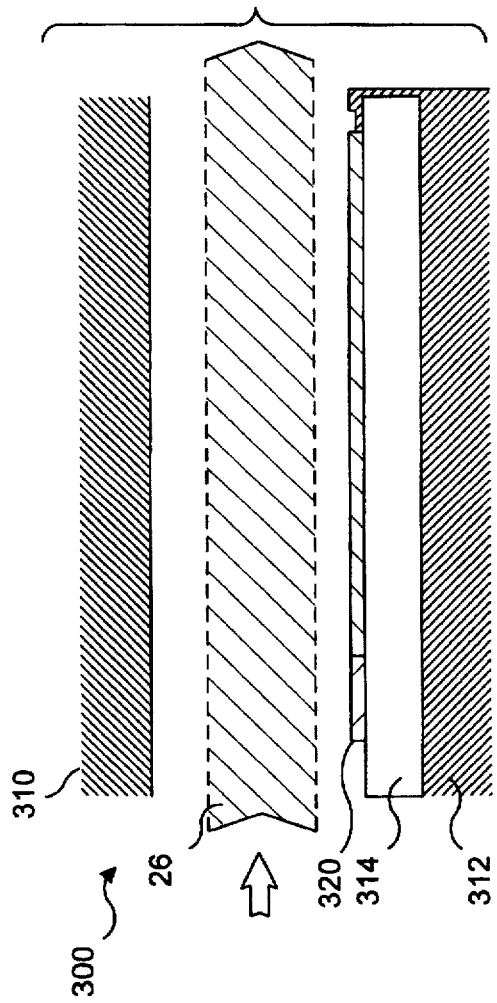
Figure 14:
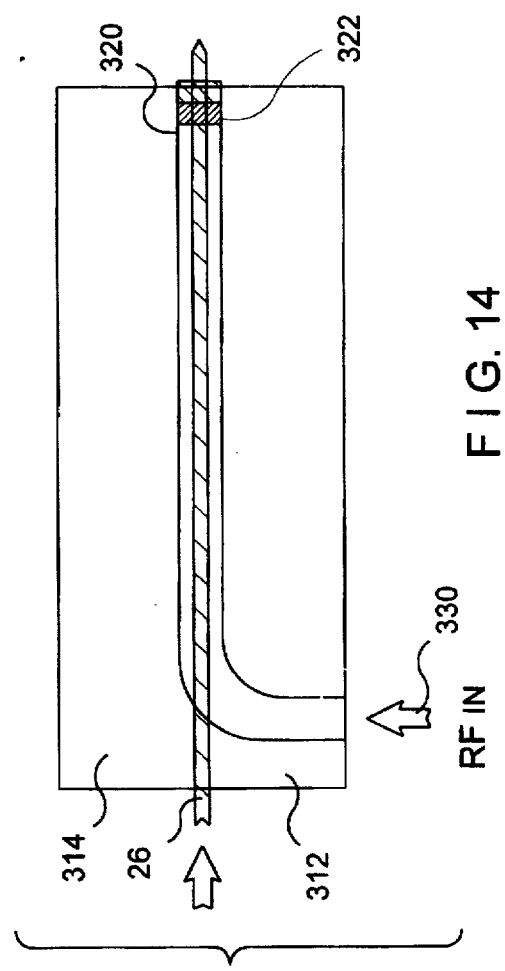
Figure 13:
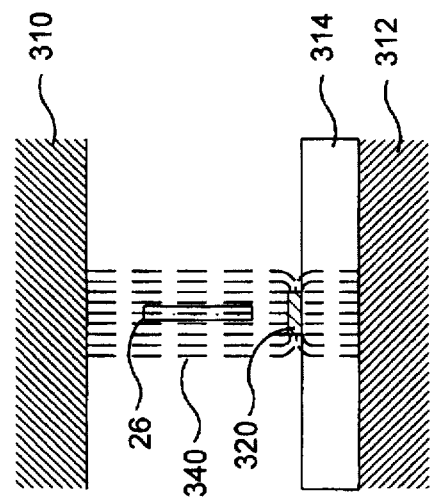
Figure 12:
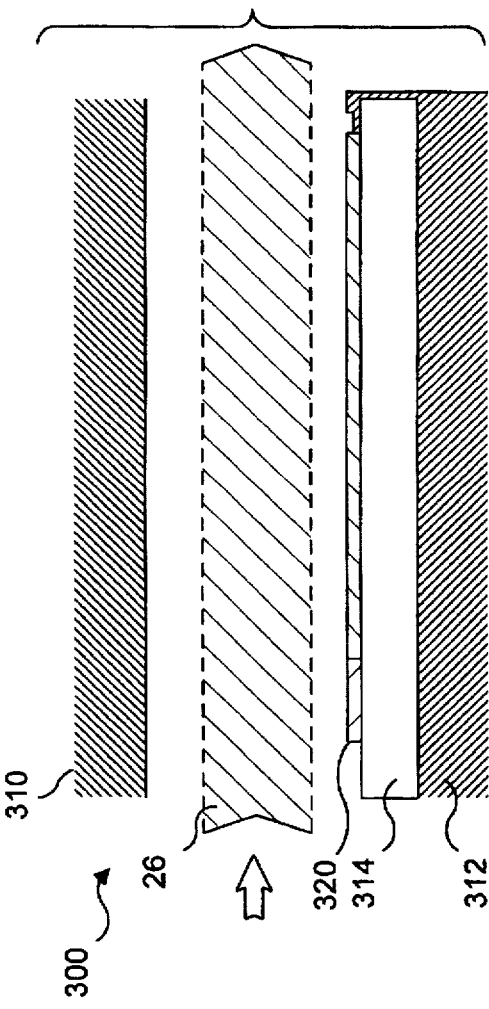
Figure 14:
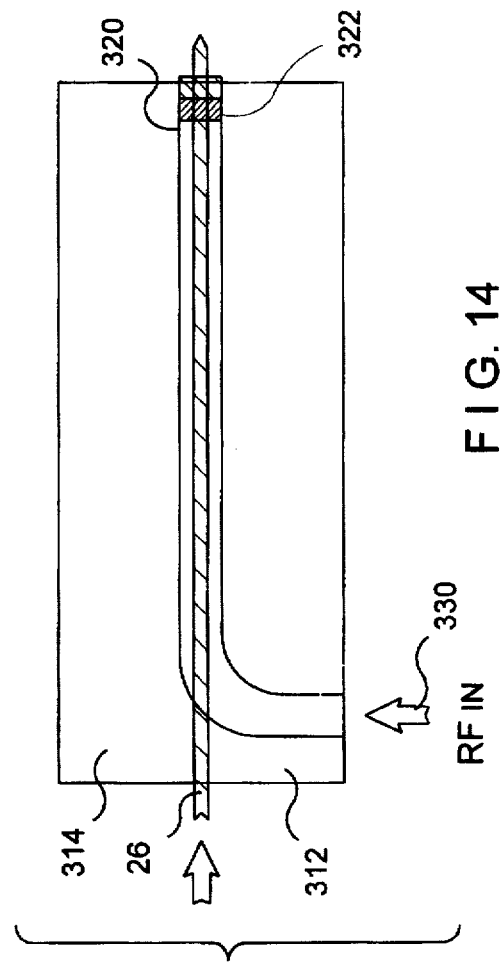

An example of a single module 50 effective over a wide frequency range is a covered microstrip vertical deflection assembly 300, shown in the respective side, cross-sectional, and top views of FIGS. 12, 13, and 14. The microstrip assembly 300 has a top ground plane 310, a bottom ground plane 312, a dielectric 314, and the microstrip line 320 terminated in a termination 322. An input signal 330 is provided by the input signal processor 30. The electric field that is developed within the assembly 300 is shown conceptually by the representation of the electric field lines 340 drawn in FIG. 13.

The covered microstrip assembly 300 functions in the capacity of a vertical deflection stage for the following reasons. Normally, the input signal 330 would travel above the microstrip 320, i.e., in a vacuum, at the speed of light c, but through the dielectric 314 at the velocity of $c/e^{1/2}$, where e is the dielectric constant of the particular material employed as the dielectric 314. For continuity, the velocity of a wave just above the microstrip line 320 must be the same as the velocity immediately below the surface, and therefore the input signal 330 actually travels through the assembly 300 at some intermediate velocity between c and $c/e^{1/2}$.

The device therefore has an effective dielectric constant $\epsilon_r$ less than e. Given the dispersive nature of microstrip line, the effective dielectric constant $\epsilon_r$ is somewhat frequency dependent and generally speaking falls with increasing frequency. Despite this and other effects, microstrip line has an extremely large bandwidth. For usable dielectric materials, the practical upper frequency limit for the covered microstrip assembly 300 employed as a vertical deflection stage is ~50 GHz. Standard textbooks such as Samuel Y. Liao, *Microwave Devices and Circuits*, Prentice-Hall, Inc. (Englewood Cliffs, N.J.: 1980), Chapter 7—Microstrip Transmission Lines, pp. 417–32, can provide the equations to determine the necessary parameters for the microstrip.

To keep pace with the input signal 330 as it passes through the microstrip line 320, the beam 26 is accelerated with a high electron volt energy. The reason that the velocity of the wave and the electron beam must be matched is to ensure that the electron beam receives a net deflection as it travels over the covered microstrip line 320. For best results, the electron beam is given a velocity based upon $\epsilon_r$ at the highest frequencies of interest. For example, for an $\epsilon_r$ of 6.5, the beam would require an energy level of approximately 45,000 electron volts.

Other arrangements are possible. For example, full stripline could be used for the vertical deflection module. As shown in the cross-sectional view of FIG. 15, a vertical deflection assembly 350 has two microstrip lines 352 and 354. Each are located on respective upper and lower dielectrics 360 and 362, situated on upper and lower ground planes 364 and 366, respectively, generating electric field lines 370. This arrangement can be driven by a differential feed from the input signal processor 30. Alternatively, one of the two striplines 352 or 354 could be fed with a pure D.C. signal to provide a vertical input offset. In yet another arrangement, a second, independent, DC-coupled RF signal could be applied to the second stripline 354, resulting in what would effectively be a true differential input at full bandwidth.

The Horizontal Stage

The horizontal stage 16 has a horizontal deflection assembly 32 and a horizontal signal processor 34. The horizontal deflection assembly 32 deflects the beam 26 in the horizontal or x axis and is controlled by the horizontal signal processor 34. The horizontal deflection assembly 32 may be a pair of capacitive plates or one could use more elaborate structures similar to those used in the vertical deflection assembly 28. For the signal processor 34, one may use a standard oscilloscope sweep circuit.

As illustrated is FIG. 1, the horizontal signal processor 34 has two inputs: a sweep input 130 and a trigger input 132. The signal applied to the trigger input 132 may be derived from the signal applied to the input signal processor 30 or it may be of independent origin.

Figure 18:
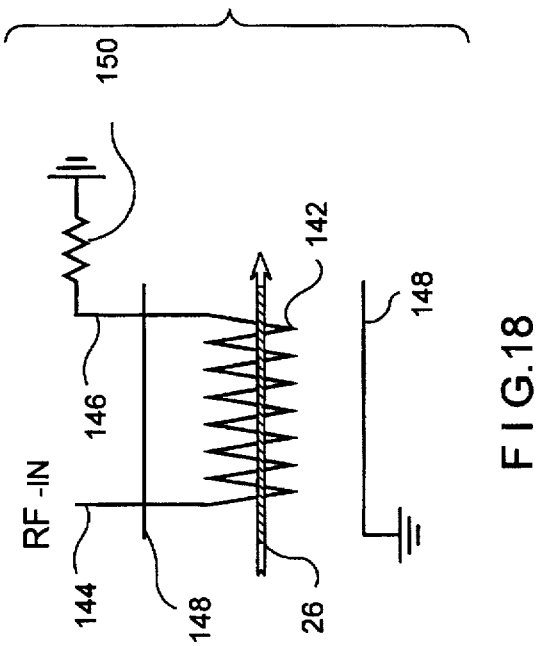
FIGS. 16, 17, and 18 are cross-sectional, top, and side views, respectively, of a horizontal deflection assembly.
Figure 16:
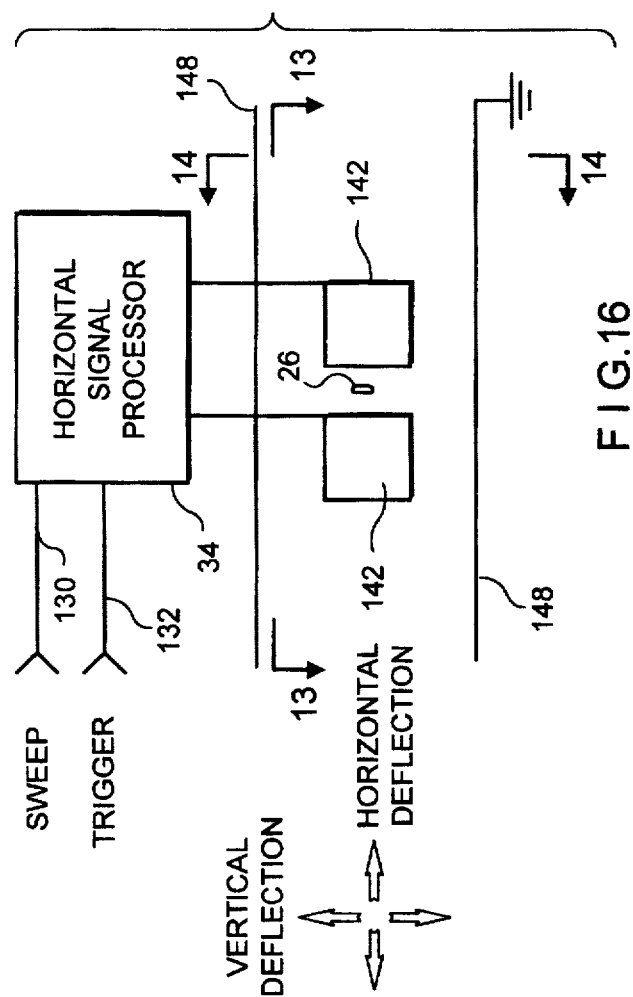
Figure 17:
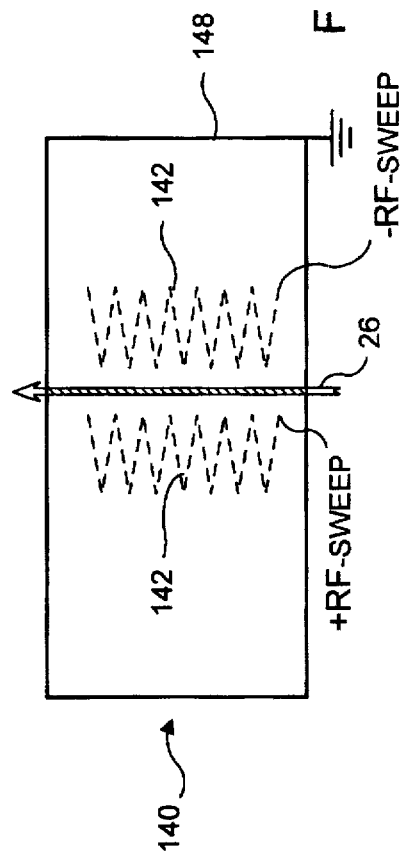

A balanced helical slow-wave module 140 is illustrated in the cross-sectional, top, and side views of FIGS. 16, 17, and 18, respectively. The module 140 has two helices 142, each having an input 144 and an output 146, contained within a grounded shield 148. The output 146 of each helix 142 is connected to a grounded termination resistor 150. The beam 26 passes between the helices 142 and is deflected by the energy passing within the helices 142. The horizontal signal processor 34 can provide complementary sinusoidal, sawtooth, or other waveforms as necessary to achieve the desired sweep performance.

Figure 19:
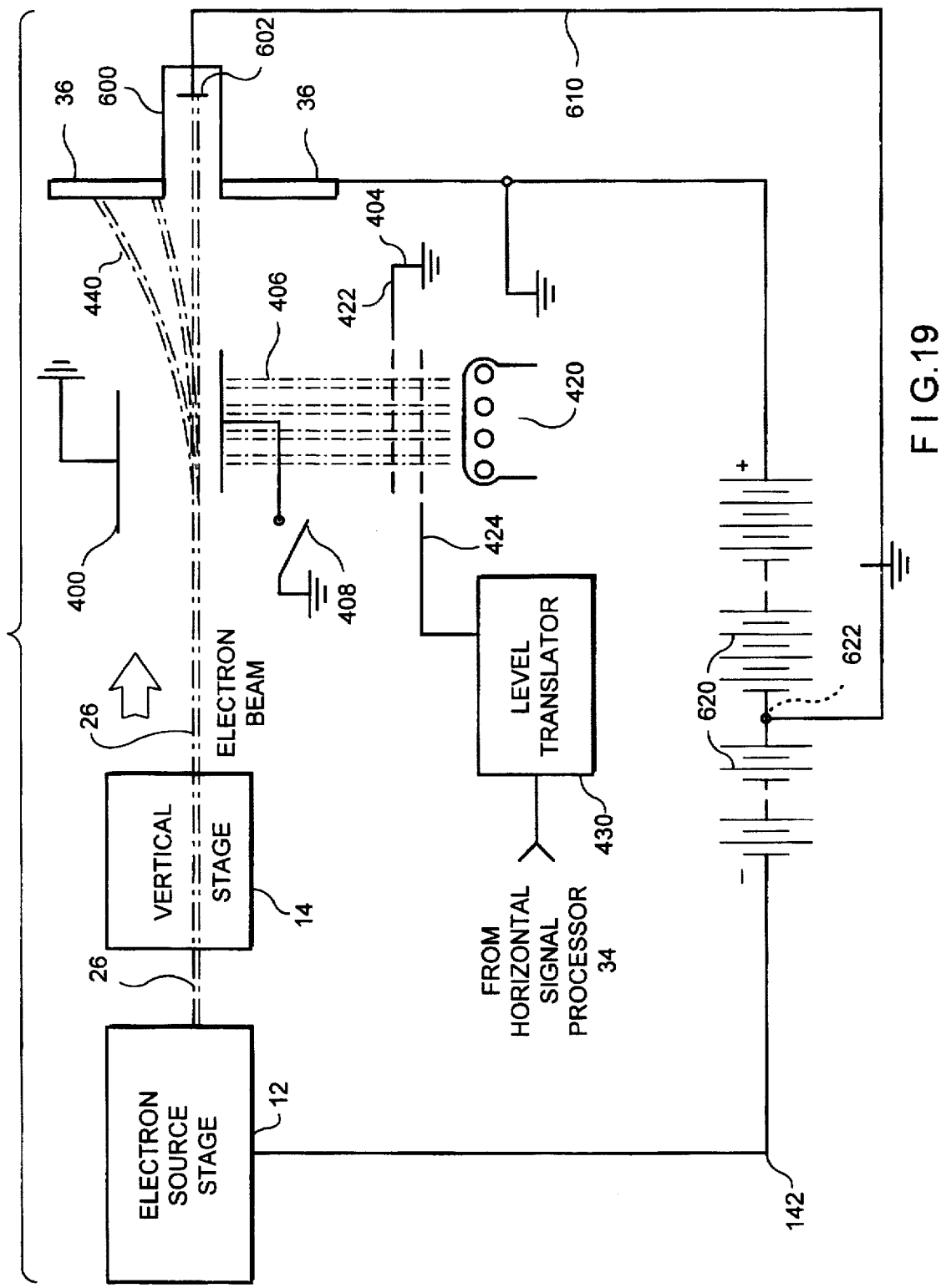
FIG. 19 is a drawing of another horizontal deflection assembly and a beam parking assembly.

Another horizontal deflection assembly 32 can be provided using charged plates excited by an electron beam. As shown in FIG. 19, the scan converter beam 26 passes through opposing plates 400 and 402. One plate 400 (or 402) is connected to ground 404; the other plate, the target plate 402 (or 400), serves as the target for a deflection electron beam 406. To allow for discharge of the plates, the target plate 402 is connected to a discharge switch 408, symbolically shown as a toggle switch in FIG. 19. The discharge switch 408 could be any type of gating, e.g., electronic, optical, or other, connected to the horizontal signal processor 34 (see FIG. 1) of the scan converter 10 (connection not shown).

The deflection electron beam 406 is generated by a deflection beam electron gun 420. The amplitude and velocity of the deflection electron beam 406 is controlled by a screen grid 422 and a blanking grid 424. The screen grid 422 is connected to ground 404.

The signal for the blanking grid 424 is received through a level translator 430 from the horizontal signal processor 34. The level translator 430 converts the output of the horizontal signal processor 34 to a signal having the form and magnitude suitable for driving the blanking grid 424.

In operation, the deflection electron beam 406 charges up the target plate 402, providing a virtually linear ramp of the voltage differential between the two plates 400 and 402, deflecting the beam 26 (440). At the end of the sweep, the discharge switch 408 closes, discharging the charge on the target plate 402, causing the main electron beam 26 to return to its zero deflection position. One advantage of this horizontal deflection arrangement is that it requires less circuitry than other configurations.

The Target Stage

As shown generally in FIG. 1, the target stage 18 has a target assembly 36 and a target signal processor 38. The target assembly 36 detects the beam 26 and the target signal processor 38 provides an output based on that detection. The goal of the target stage 18 is to determine the amount of deflection of the beam. Three embodiments will be discussed: a charge storage array, a charge-coupled device array, and a split-beam charge-coupled device array. It should be understood that other target arrangements could be used as well.

Figure 20:
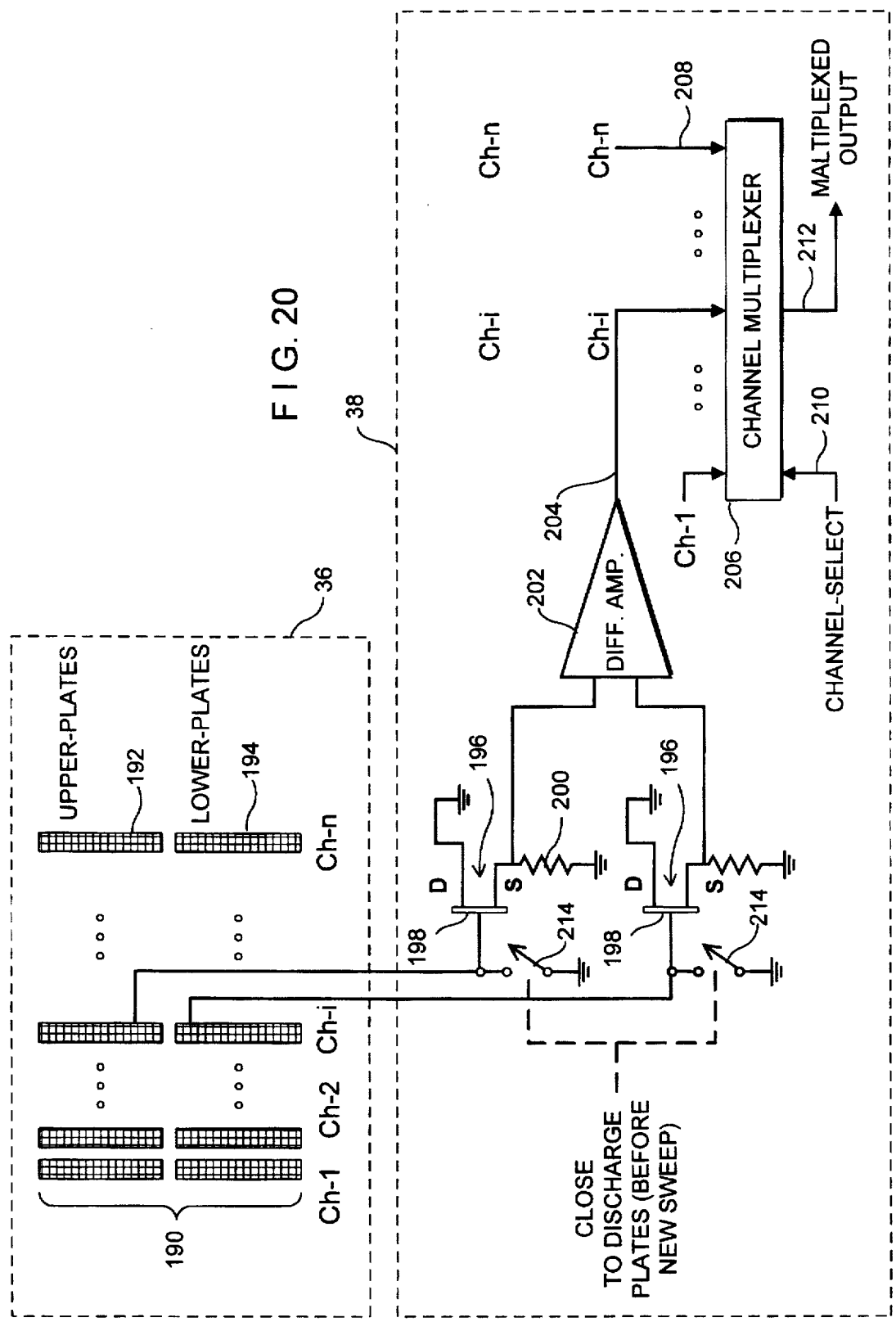
FIG. 20 is a schematic block diagram of a target assembly having a charge storage array and an associated target signal processor.

The charge storage array version of the target assembly 36 and an associated signal processor 38 are shown in FIG. 20. The target assembly 36 has a charge storage array 190 which has a series of upper and lower capacitive plates 192 and 194, respectively. Each pair of upper and lower plates 192 and 194 is arbitrarily designated a channel, collectively providing n channels Ch.-1 to Ch.-n. The plates 192 and 194 of the array 190 can be a thin film pattern etched on a suitable substrate.

Each individual plate 192 or 194 is connected to a very high impedance, low noise amplifier 196 in the signal processor 38. The amplifiers 196 are configured as source followers, having FETs 198 as active devices and source resistors 200. The sources of the FETs 198 corresponding to each pair of upper and lower plates 192 and 194 are connected to the inputs of a differential amplifier 202 that yields a comparison signal at its output 204. Note that other active devices and amplifier configurations, preferably having a high input impedance, could be used.

The charge storage array 190 works as follows. As the beam 26 sweeps across the individual plates 192 and 194 of the array 190, charge is deposited. Since:

$$Q=CV$$

where Q=charge
C=capacitance of the plate
V=voltage
then the voltage produced at the input to each amplifier 196 is:

$$V=\frac{Q}{C}$$

If there is no deflection, the outputs of the upper and lower plates 192 and 194 are equal and cancel in the differential amplifier 202. However, if the beam is deflected vertically, the charge on one plate in a pair of upper and lower plates 192 and 194 will be greater than the charge on the other, causing a difference in the inputs to the differential amplifier 202. Since the capacitance of the plates 192 and 194 is low and the input impedance of the amplifiers 196 is very high, relatively small changes in the differential charge yield large swings in the output voltage of the differential amplifier 202. Thus, the converter is highly sensitive.

To decode the output of the target assembly 36, one can tie the outputs 204 of the differential amplifiers 202 to a multiplexer 206. The multiplexer 206 has several selectable inputs 208, selected by select lines 210, to yield an output 212. One could digitize the output of the target assembly 36 before sending it to the multiplexer 206 or afterwards, depending on the particular application and individual design requirements.

The projection of the electron beam 26 onto the target assembly 36 is shown in FIG. 21. This drawing shows the electron gun assembly, the focusing assembly, the vertical deflection assembly 28, and the target assembly 36 together with the amplifiers 196 and differential amplifiers 202. Ideally, the width of the beam 26 is no greater than the width of a single upper or lower plate 192 or 194. A single pair of upper and lower plates 192 and 196 and an associated differential amplifier are shown in FIG. 22.

An important benefit of using a differential system, e.g., the combination of upper and lower plates 192 and 194, is that virtually any noise on the beam 26 is cancelled. Moreover, it permits one to detect not only infinitesimal amounts of deflection but also much greater swings, resulting in a very large dynamic range.

The upper and lower plates 192 and 194 will retain their charge after each sweep of the beam 26. Therefore, one can discharge the charge storage array 190 by connecting the plates to ground through a switch 214 after the charge has been read by low noise amplifiers 196 or after the beam 26 has completed an entire sweep across the target assembly 36.

Figure 23:
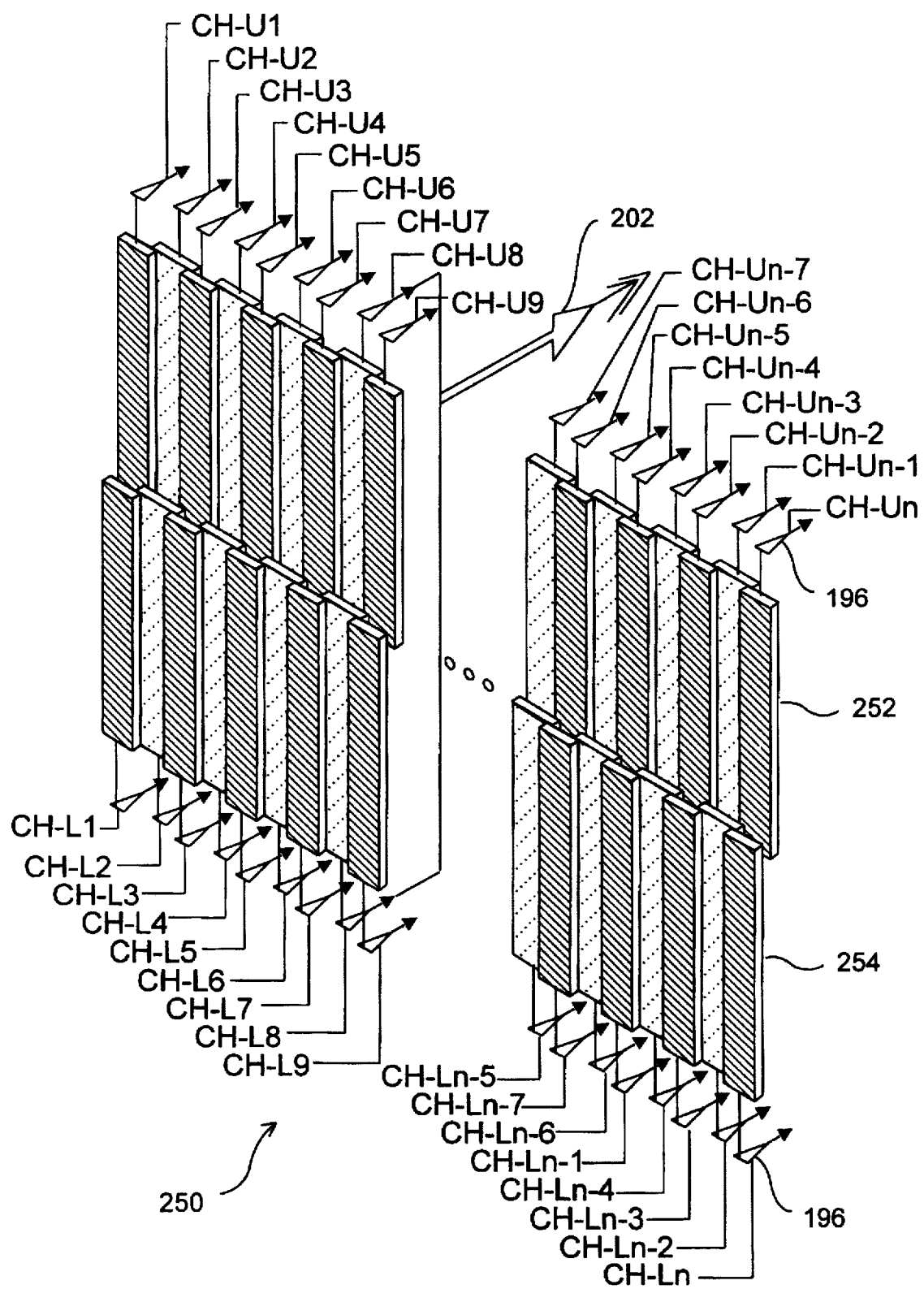
FIG. 23 is a drawing of another charge storage array for a target assembly.

As shown in FIG. 23, one may use other arrangements for the charge storage array. The array 250 in FIG. 23 has staggered and overlapping upper and lower plates 252 and 254. Here, the plates 252 and 254 of the array 250 can be a multi-layer thin film pattern etched on a suitable substrate.

To accommodate for irregularities in the horizontal sweep, especially at higher frequencies, one can vary the plate-to-plate spacing. Also, one can adjust the geometry of individual plates to compensate for other irregularities or provide a non-linear symmetric or asymmetric transfer function (e.g., sinusoidal, sawtooth, logarithmic, exponential, etc.).

Alternatively, one could employ a single-ended target assembly 36 which yields an absolute indication of the received beam. For example, a continuous strip could be substituted for the lower plates 194 (or upper 192 plates). Each individual plate would form one input to one of a series of amplifiers while the continuous strip would form the common or ground input. Because this arrangement senses absolute and not differential charge, it offers reduced performance and is more susceptible to noise.

Figure 24:
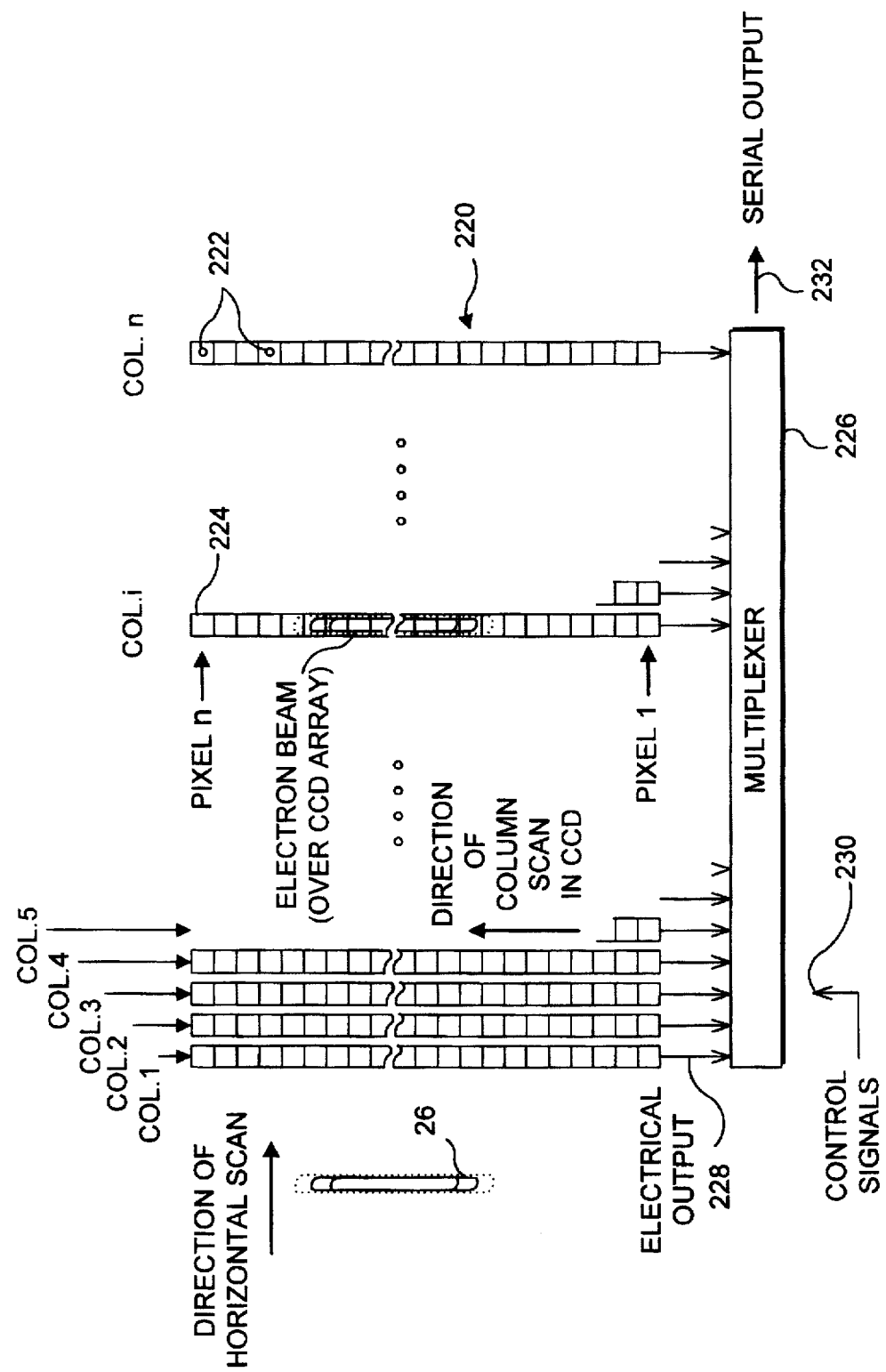
FIG. 24 is a schematic block diagram of a target assembly having an array of charge-coupled-devices and an associated signal processor.

Another embodiment of the target assembly 36, shown in FIG. 24, uses an array 220 of charge-coupled device pixels 222. The array 220 has several columns 224, which are oriented vertically to provide a target that has the same orientation as the cross-section of the beam 26. The orientation could be changed to accommodate an electron beam having a different orientation. Each CCD pixel 222 provides an output proportional to the charge received from the beam 26.

Note that in a commercially available CCD device, the pixels are arranged raster-fashion in lines. Because of the vertical orientation used here, the lines are referred to as columns. One can use an off-the-shelf device or fabricate a custom CCD array for this purpose of this device.

To determine beam deflection using the CCD array 220, one could locate the beam's centroid with respect to the electron boresight 20. To do so, one would perform the following calculation:

$$i_d = \frac{\sum_{i=1}^{n} N_{e_i} * i}{\sum_{i=1}^{n} N_{e_i}}$$

where $i_d$=position of the centroid;

$N_e$=number of electrons received by a given CCD pixel 222;

n=number of CCD pixels 222 in a row 224; and i=$i^{th}$ pixel in the array.

Thus, the location of the centroid $i_d$ is the sum of the products of the total charge at each pixel and the pixel number, divided by the sum of charge for the entire array 220. The plot in FIG. 25 shows a sample distribution of electrons along the vertical axis.

To read the CCD pixels 222, one could clock out the value of each CCD in a horizontal row using n lines 228 feeding a multiplexer 226. The multiplexer 226 would select the appropriate lines using its select lines 230 to produce the CCD values at its output 232. Because the CCD pixels 222 automatically discharge upon reading, it is not necessary to discharge the array 220 in the manner required by the charge storage array 190 of FIG. 20.

If a single channel would suffice, one could dispense with the horizontal stage 16. Thus, there would only be one detector and no horizontal movement of the beam would be required.

Instead of using charge-coupled devices, one could provide the matrix configuration of the CCD array 220 using the etched capacitive plates of the charge storage array 190. Suitable output and decoding circuitry would be provided.

A Split-Beam Optical Target Assembly

Figure 26:
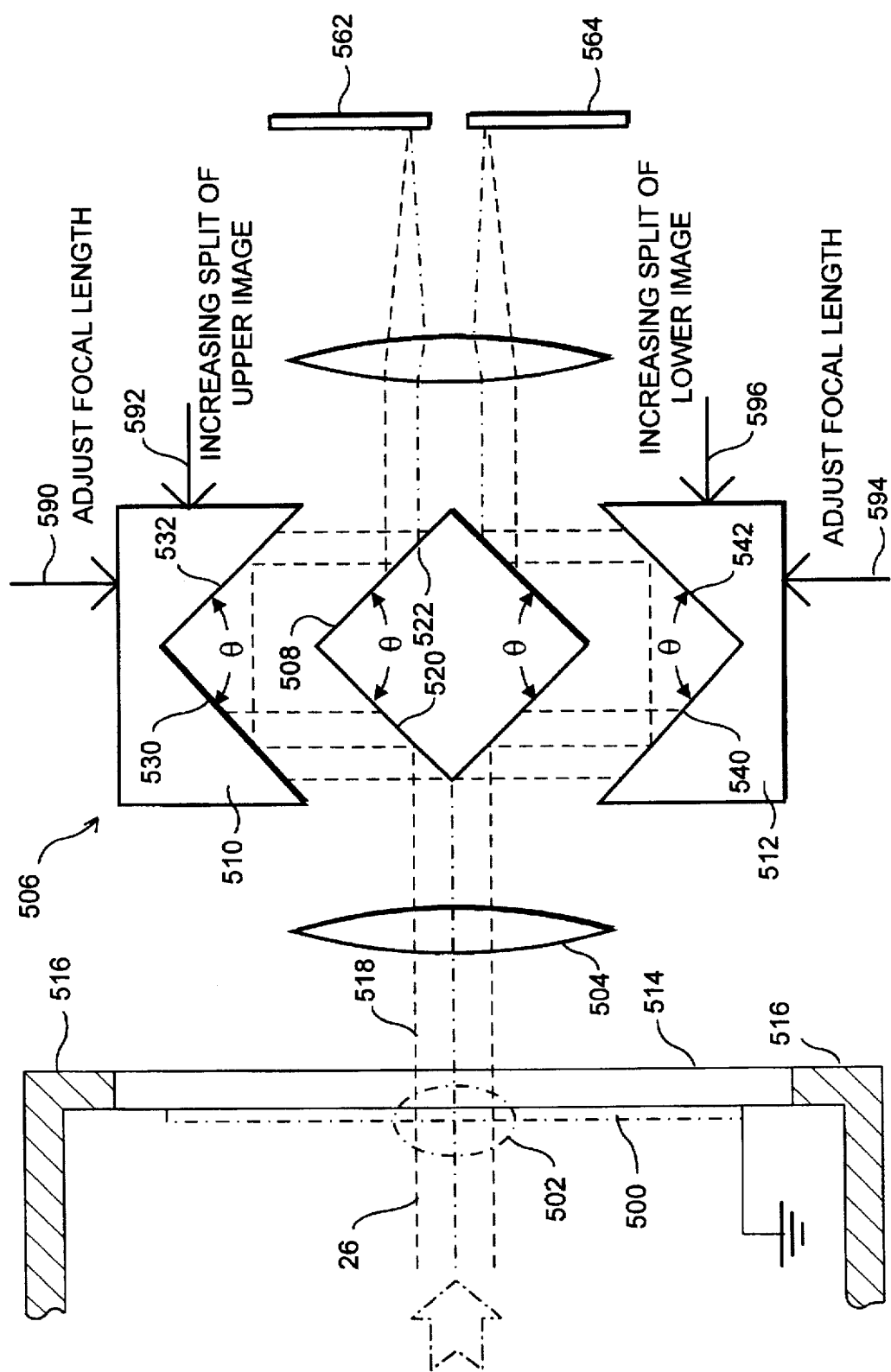
FIG. 26 is a drawing of a target assembly having a beam-splitting assembly for generating a split-image of the beam.

In another arrangement, a phosphor screen is used to develop an initial image of the electron beam 26 which is then split and directed to a bifurcated CCD target assembly. As illustrated in FIG. 26, the beam 26 impinges on an aluminized phosphor screen 500 deposited on the faceplate 514 of the vacuum envelope 516 of the scan converter 10, internal to the evacuated enclosure, creating the screen image 502 shown in FIGS. 26 and 27. Note that electron beam targets other than aluminized phosphor screens, such as scintillators, could be used. The image 502 on the phosphor screen 500 is projected in the form of rays 518 that are focused by a screen image focusing lens 504 and directed to a beam-splitting assembly 506.

The beam-splitting assembly 506 has three components: a beam splitter block 508, an upper reflecting angle block 510, and a lower reflecting angle block 512. The beam splitter block 508 has four reflective surfaces 520, 522, 524, and 526. The beam splitter block 508 can be a perfect square relative to the vertical plane of the beam 26. In that case, the respective angles θ and φ are each 90° and adjacent reflective surfaces (520 and 522, 522 and 524, 524 and 526, and 526 and 520) are at right angles to one another.

The upper reflecting angle block 510 and the lower reflecting angle block 512 each have two reflective surfaces 530 and 532, and 540 and 542, respectively. Since the angles between adjacent reflective surfaces 520, 522, 524, and 526 on the beam splitter block 508 are each 90°, the angles between reflective surfaces 530 and 532, and reflective surfaces 540 and 542, are each 90°.

If the respective angles θ and φ in the beam splitter block 508, the upper reflecting angle block 510, and the lower reflecting angle block 512 are not 90°, at the very least the opposing surfaces, e.g., the reflective surface 520 on the deflecting block 508 and the reflective surface 530 on the upper reflecting angle block 510, should be parallel to one another.

When the rays 518 of the screen image 502 enters the beam splitter 506, they are literally split, at the location of the focal plane 544 of the screen image focusing lens 504, by the beam splitter block 508, the upper portion of the rays 550 passing above the beam splitter block 508, and the lower portion of the rays 552 of the image 502 passing below the block 508, as shown in FIGS. 26 and 28. Because the lower reflecting angle block 512 is offset along the beam path 20 with respect to the upper reflecting angle block 510, the upper and lower portions of the rays 550 and 552 emerge from the beam splitter 506 apart from each other. The split image. i.e., the upper and lower portions of the rays 550 and 552, then passes through a split image focusing lens assembly 556, positioned in front of a split CCD array 560. The array 560 is positioned at the focal point of the lens 556 for an image first appearing at the focal plane 544 of the screen image focusing lens 504.

The split CCD array 560 has an upper CCD array 562 and a lower CCD array 564, separated by a distance 566. Note that the upper and lower arrays 562 and 564 need not lie in the same plane. The upper and lower portions of the rays 550 and 552 result in upper and lower images 568 and 570 on the upper and lower CCD arrays 562 and 564, respectively. The upper and lower CCD arrays 562 and 564 each have a plurality of channels 568 and the arrays have outputs 576 and 578, respectively, connected to respective inputs of a differential amplifier 580, as shown in FIG. 29. It is assumed that the split CCD array 560 has built-in circuitry for separately clocking out the outputs of each channel 568. Finally, the output of the differential amplifier 580 is provided to an A-D converter 582 to convert the output of each of the split CCD array channels 568 into a digital signal appearing by the discrete digital outputs 584.

By moving either of the reflecting angle blocks 510 or 512 away from the beam splitter block 508, using the respective upper and lower screen image portion focus adjustments 590 and 594, the path of either the upper portion of the rays 550 or the lower portion of the rays 552 is lengthened, allowing one to precisely focus the individual portions on the respective upper and lower CCD arrays 562 and 564. Similarly, by moving either of the reflecting angle blocks 510 or 512 laterally with respect to the beam path 20 and the beam splitter block 508, using the respective upper and lower screen image portion offset adjustments 592 and 596, the vertical position of the respective upper and lower portions of the rays 550 and 552 on the respective upper or lower CCD array 562 or 564 can be moved. The upper and lower screen image portion focus adjustments 590 and 594 and the upper and lower screen image portion offset adjustments 592 and 596 can be screw-type positioning devices or any other suitable arrangement.

The combination of the beam-splitting assembly 506 and the split CCD array 560 offers several advantages. First, there is a significant gain improvement over the detection of a unified beam, since as the electron beam 26 passes through the phosphor, each electron in the beam 26 will generate many photon events in the phosphor until the beam has fully dissipated. Second, unlike the CCD arrangement of FIG. 24, it moves the CCD array 260 and the differential detection out of the evacuated enclosure of the scan converter 10. Third, because the rays are split into two portions, a much larger guard band is obtained for the CCD array 260, with virtually no dead band i.e., no loss in the optical signal.

The gain of the scan converter 10 utilizing the phosphor screen 500 can be increased by grinding the screen image focusing lens 504 so that it magnifies the rays 518 of the screen image 502. With a magnifying lens 504, the vertical and horizontal deflection, and therefore the gain, is effectively increased without having to increase gain in the vertical or horizontal stages 14 and 16. In fact, one could shorten the length of the vertical deflection assembly 28 and still achieve the desired signal resolution. Moreover, the shortened assembly 28 will yield increased bandwidth.

Beam Parking

Normally, the beam 26 impinges on the target with essentially full force. When the scan converter 10 is not in use, there is no deflection of the beam 26. If the beam 26 is not disabled or significantly reduced in strength at such times, it could destroy or burn up the target. Such an effect is not unlike the holes and lines burnt in phosphor in a conventional oscilloscope left with the beam at full intensity and zero deflection.

To counteract the deleterious effects of a steady, undeflected beam 26, a beam parking arrangement is provided. As shown in FIG. 19, a beam well 600 is positioned at the center of the target assembly 36, essentially at the point where the beam 26 is at zero horizontal and vertical deflection, to capture the beam 26. The beam well 600 would have to be of such dimensions as to capture the entire cross-section of the beam 26. A beam target 602 in the beam well 600 is connected to a depressor voltage line 610 which in turn is connected to a high voltage power supply 620 at a voltage tap 622.

The main purpose of the power supply 620 is to provide the voltage necessary to propel the beam 26. For that function, it is connected by a negative return 624 to the electron gun assembly 22 and by a high voltage line 626 to the target assembly 36. The voltage tap 622 can be arranged to provide a potential on the beam target 602 that is x% of the voltage, e.g., 10%, on the target assembly 36.

The advantages of this arrangement are that it will decrease dissipation, eliminate the need for gating the beam 26 (shutting it off), and decrease the power requirements of the high voltage supply 622. Given that the beam 26 is focused on the beam target 602 when the beam 26 is at zero deflection, dissipation within the scan converter 10 is reduced. Because the energy in the beam 26 can recirculate indefinitely, there is no need to turn off the beam 26 or provide a blanking pulse to achieve shut-off. Finally, the requirements for the high voltage power supply 620 are relaxed because the current flow during non-use (i.e., zero deflection) is minimal, given that the difference between the voltage on the beam target 602 and the voltage provided to the electron gun assembly 22 is relatively small. The only significant power use occurs during periods of deflection and this is largely an instantaneous current, the average again being relatively small.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An apparatus for storing a time varying analog signal n real time for later read out, comprising:
  means for sequentially breaking up a time varying signal having an amplitude into discrete time intervals, said means for breaking up including means for supplying an electron beam;
  means for deflecting said electron beam in accordance with said time varying signal, means for further deflecting said electron beam along an axis substantially perpendicular to that axis along which said beam is deflected with said time varying signal
  means for detecting and storing said deflected electron by means of an array of rectangularly shaped charge detector elements; and means for taking each of said charges from said detector elements so that said charges can be read at a lower rate than the rate at which said charges were originally stored.

2. The apparatus according to claim 1 wherein said array of rectangularly shaped detector elements is a linear array.

3. The apparatus according to claim 1 wherein said detector elements are single ended.

4. The apparatus according to claim 1 wherein said detector elements are differential detector elements.

5. An apparatus as set forth in claim 1, wherein the means for generating an energy beam includes means for generating a sheet beam.

6. An apparatus as set forth in claim 1, wherein the means for generating an energy beam includes means for focusing the beam in only one direction.

7. An apparatus as set forth in claim 1, wherein the means for generating an energy beam includes means for generating a beam having an approximately rectangular cross-section.

8. An apparatus as set forth in claim 1, wherein the means for generating an energy beam includes means for generating a beam having an elliptical cross-section.

9. An apparatus as set forth in claim 1, wherein the means for deflecting includes means for synchronizing the input signal with the beam.

10. An apparatus as set forth in claim 1, wherein the means for deflecting includes means for selectively delaying the input signal.

11. An apparatus as set forth in claim 1, wherein the means for deflecting includes at least one bandwidth-specific means for deflecting the beam in response to a corresponding bandwidth-specific portion of the input signal.

12. An apparatus as set forth in claim 1, wherein the means for deflecting includes a plurality of bandwidth-specific means for deflecting the beam in response to corresponding bandwidth-specific portions of the input signal.

13. An apparatus as set forth in claim 1, wherein the means for deflecting includes a helical slow-wave structure.

14. An apparatus as set forth in claim 1, wherein the means for deflecting includes a stripline slow-wave structure.

15. An apparatus as set forth in claim 1, wherein the means for deflecting includes a waveguide slow-wave structure.

16. An apparatus as set forth in claim 1, wherein the means for deflecting includes at least one microstrip.

17. An apparatus as set forth in claim 1, further including sweep means for deflecting the beam in a dimension not parallel with the deflection corresponding to the input signal.

18. An apparatus as set forth in claim 17, wherein the means for deflecting the beam in a dimension not parallel with the deflection corresponding to the input signal includes electrostatic means excited by an electron beam.

19. An apparatus as set forth in claim 1, wherein the means for determining includes means for storing a charge.

20. An apparatus as set forth in claim 1, wherein the means for determining includes:
means for sensing the electron beam at a first location and providing an output representative of the sensing;
means for sensing the electron beam at a second location and providing an output representative of the sensing; and
means for comparing the outputs of the two means.

21. An apparatus as set forth in claim 1, wherein the means for determining includes means for sensing charge at a plurality of points.

22. An apparatus as set forth in claim 21, wherein the means for sensing is an array of charge-coupled devices.

23. An apparatus as set forth in claim 21, wherein the means for determining includes means for comparing the outputs of the means for sensing charge.

24. An apparatus as set forth in claim 1, wherein the energy beam has a cross-section and wherein the means for determining includes means for dividing the cross-section of the energy stream into at least two portions.

25. An apparatus as set forth in claim 24, wherein the means for determining includes means for developing an intermediate image of the cross-section of the energy beam and wherein the means for dividing the energy beam into at least two portions includes means for optically splitting the image.

26. An apparatus as set forth in claim 24, wherein the means for determining includes means for magnifying the intermediate image.

27. The apparatus according to claim 1 wherein said means for deflecting includes a multiplicity of vertical deflectors each optimized for use in a given frequency band.

28. The apparatus according to claim 1 wherein said time varying analog signal is a radio frequency signal having a phase velocity and said means for deflecting matches said phase velocity of said radio frequency signal to that of said electron beam to be deflected thereby providing an extremely large signal bandwidth.

29. The apparatus according to claim 1 wherein said means for deflecting includes a differentially balanced microstrip deflector for matching said phase velocity of said radio frequency signal to that of said electron beam to be deflected to provide extremely large signal bandwidth.

30. The apparatus according to claim 1 wherein said electron beam is a primary electron beam and said means for deflecting said electron beam along an axis substantially perpendicular to said axis along which said electron beam is deflected with respect to said time varying signal further includes a second electron beam having a control signal for initiating said second electron beam and gating means which can gate said second electron beam on in response to said control signal, said second electron beam charging a first one of a pair of conducting plates, a second one of said plates being at a fixed potential, thereby causing a linearly increasing electric field with respect to time to exist between said pair of said conducting plates.

31. The apparatus according to claim 30 further includes a beam depressor for minimizing system power requirements when said primary electron beam is being scanned at other than along an axis substantially perpendicular to said axis of deflector of said time varying signal.

32. An apparatus for storing a time varying analog signal in real time for later read out, comprising:
means for sequentially breaking up a time varying signal having an amplitude into discrete time intervals, said means for breaking up including means for supplying an electron beam;
means for deflecting said electron beam in accordance with said time varying signal, means for further deflecting said electron beam along an axis substantially perpendicular to that axis along which said beam is deflected with said time varying signal;
means for converting said deflected electron beam into a beam of photons;
means for detecting and storing said beam of photons by means of an array of detector elements; and
means for taking each of said photons from said detector elements so that said photons can be read at a lower rate than the rate at which said charges were originally stored.

33. The apparatus according to claim 32 wherein said array of rectangularly shaped detector elements is a linear array.

34. The apparatus according to claim 32 wherein said detector elements are single ended.

35. The apparatus according to claim 32 wherein said detector elements are differential detector elements.

36. The apparatus according to claim 32 wherein said means for converting said deflected electron beam into photons includes a luminescent screen.

37. A method for storing a time varying analog signal in real time for later read out, the steps comprising:

sequentially breaking up a time varying signal having an amplitude into discrete time intervals, said step for breaking up including supplying an electron beam;

deflecting said electron beam in accordance with said time varying signal, further deflecting said electron beam along an axis substantially perpendicular to that axis along which said beam is deflected with said time varying signal;

detecting and storing said deflected electron beam by means of an array of rectangularly shaped charge detector elements; and taking each of said charges from said detector elements so that said charges can be read at a lower rate than the rate at which said charges were originally stored.

38. The method according to claim 37 wherein said array of rectangularly shaped detector elements is a linear array.

39. The method according to claim 37 wherein said detector elements are single ended.

40. The method according to claim 37 wherein said detector elements are differential detector elements.

41. A method for storing a time varying analog signal in real time for later read out, comprising:

sequentially breaking up a time varying signal having an amplitude into discrete time intervals, said step for breaking up including means for supplying an electron beam;

deflecting said electron beam in accordance with said time varying signal, means for further deflecting said electron beam along an axis substantially perpendicular to that axis along which said beam is deflected with said time varying signal;

converting said deflected electron beam into a beam of photons;

detecting and storing said beam of photons by means of an array of detector elements; and taking each of said photons from said detector elements so that said photons can be read at a lower rate than the rate at which said charges were originally stored.

42. The method according to claim 41 wherein said array of rectangularly shaped detector elements is a linear array.

43. The method according to claim 41 wherein said detector elements are single ended.

44. The method according to claim 41 wherein said detector elements are differential detector elements.

45. The method according to claim 41 wherein said means for converting said deflected electron beam into photons includes a luminescent screen.

* * * * *